(12) United States Patent
Ogura et al.

(10) Patent No.: US 7,041,371 B2
(45) Date of Patent: May 9, 2006

(54) POLYETHYLENE GLYCOL-MODIFIED SEMICONDUCTOR NANOPARTICLES, METHOD FOR PRODUCING THE SAME, AND MATERIAL FOR BIOLOGICAL DIAGNOSIS

(75) Inventors: Atsuhiko Ogura, Tsuchiura (JP); Eui-chul Kang, Tsukuba (JP); Kazunori Kataoka, Tokyo (JP); Yukio Nagasaki, Moriya (JP)

(73) Assignee: NOF Corporation, Tokyo (JP)

( * ) Notice: Subject to any disclaimer, the term of this patent is extended or adjusted under 35 U.S.C. 154(b) by 0 days.

(21) Appl. No.: 10/810,305

(22) Filed: Mar. 26, 2004

(65) Prior Publication Data

US 2004/0250745 A1 Dec. 16, 2004

(30) Foreign Application Priority Data

Mar. 31, 2003 (JP) .......................... P2003-093900

(51) Int. Cl.
*B32B 5/16* (2006.01)

(52) U.S. Cl. ................ 428/403; 428/407; 252/301.6 S; 252/301.4 S; 252/301.4 R

(58) Field of Classification Search ................ 428/403, 428/407; 252/301.6 S, 301.4 S, 301.4 R
See application file for complete search history.

(56) References Cited

U.S. PATENT DOCUMENTS

| | | | |
|---|---|---|---|
| 5,990,479 A * | 11/1999 | Weiss et al. ................ 250/307 |
| 6,207,229 B1 | 3/2001 | Bawendi et al. | |
| 6,251,303 B1 * | 6/2001 | Bawendi et al. ...... 252/301.4 R |
| 6,319,426 B1 * | 11/2001 | Bawendi et al. ...... 252/301.4 R |
| 6,326,144 B1 * | 12/2001 | Bawendi et al. ................ 435/6 |
| 6,444,143 B1 * | 9/2002 | Bawendi et al. ...... 252/301.6 S |
| 6,649,138 B1 * | 11/2003 | Adams et al. .............. 423/403 |
| 6,774,361 B1 * | 8/2004 | Bawendi et al. ............ 250/307 |
| 6,855,551 B1 * | 2/2005 | Bawendi et al. ................ 436/6 |

FOREIGN PATENT DOCUMENTS

JP 2002-121549 A1 4/2002

OTHER PUBLICATIONS

Andrey L. Rogach, et al., "Synthesis and Characterization of a Size Series of Extremely Small Thiol-Stabilized CdSe Nanocrystals", J. Phys. Chem. B, 1999, 103, 3065-3069.
Dmitri V. Talapin, et al., "Synthesis and surface modification of amino-stabilized CdSe, CdTe and InP nanocrystals" Colloids and Surfaces, A: Physicochemical and Engineering Aspects, 202 (2002) 145-154.

(Continued)

Primary Examiner—Ieszek B. Kiliman
(74) Attorney, Agent, or Firm—Darby & Darby

(57) ABSTRACT

This invention provides PEG-modified semiconductor nanoparticles of which fluorescence intensity is effectively inhibited from lowering, which are capable of forming a stable dispersion in water, and which are capable of bonding easily with biomolecules having specific recognition, as well as methods for conveniently preparing such nanoparticles, and a material for biological diagnosis. The water-soluble PEG-modified semiconductor nanoparticles of the present invention includes a structure having PEG of a number average molecular weight of 300 to 20000 having a thiol group at one end, bonded via cadmium to II–VI semiconductor nanocrystals of a core-shell structure having a ZnX (wherein X stands for O, S, Se, or Te) shell.

8 Claims, 1 Drawing Sheet

OTHER PUBLICATIONS

Xingyong Wu et al., "Immunogluorescent labeling of cancer marker Her2 and other cellular targets with semiconductor quantum dots", Nature Biotechnology, published online Dec. 2, 2002, pp. 1-6.

* cited by examiner

US 7,041,371 B2

POLYETHYLENE GLYCOL-MODIFIED SEMICONDUCTOR NANOPARTICLES, METHOD FOR PRODUCING THE SAME, AND MATERIAL FOR BIOLOGICAL DIAGNOSIS

FIELD OF ART

The present invention relates to water-soluble semiconductor nanoparticles of nanometer size, modified with polyethylene glycol (PEG), methods for producing the same, and materials for biological diagnosis containing the nanoparticles.

BACKGROUND ART

It is reported, for example in U.S. Pat. No. 6,207,229, that II–VI semiconductor nanocrystals may be synthesized in a coordinating solvent, trialkyl phosphine/trialkyl phosphine oxide. The semiconductor nanocrystals are known to have optical characteristics that are different from those of bulk semiconductor. For example, the semiconductor nanocrystals are capable of coloring and emitting light of various wavelengths depending on their size, have a broad absorption range, and are excited to emit light by excitation light of a single wavelength. The fluorescence spectrum of the semiconductor nanocrystals is narrow and highly symmetric. Further, the semiconductor nanocrystals, compared to organic dyes, have superior durability and anti-fading property. As such, the semiconductor nanocrystals have recently been studied intensively for applications not only in optics and electronics such as display elements and recording materials, but also in fluorescent markers and biological diagnosis.

Quantum dots, which are semiconductor nanocrystals, are water-insoluble per se. For application in biological diagnosis, quantum dots thus have to be formed into a stable dispersion in water by changing/modifying their crystal surface. For solubilization of quantum dots in water, there are reported methods of bonding mercaptoethanol or thioglycerol, or low molecular thiol compounds such as mercaptoundecanoic acid or lipoic acid, to the surface of semiconductor nanocrystals (e.g., Journal of Physical Chemistry B, 103, 3065 (1999) and U.S. Pat. No. 6,319,426).

However, such water solubilizers have non-specific adsorption, which cannot be inhibited sufficiently for application in biological diagnosis. This may cause problems in highly sensitive detection of only the objective trace substance.

On the other hand, a report is made on the use of polyacrylic acid partially modified with octylamine for dispersing CdSe semiconductor nanocrystals having a ZnS shell in water (e.g., Nature Biotechnology, Online Version, 2(2002)). However, this method requires three steps for solubilization of semiconductor nanocrystals in water, and is thus complicated.

There is also a publication that discloses a concept of semiconductor nanocrystals as a material for biological diagnosis to which an affinity molecule is bonded via a linking agent (e.g., U.S. Pat. No. 5,990,479). However, this publication does not pay attention to inhibition of non-specific adsorption of the linking agent. Still less, no example is disclosed wherein the affinity molecule is actually bonded to semiconductor nanocrystals, but mere preparation of semiconductor nanocrystals is disclosed.

There is also proposed to solubilize semiconductor nanocrystals in water, such as those of CdSe having a ZnS shell, by bonding polyalkylene glycol having a thiol group at one end to the nanocrystals, for preparing a material for biological diagnosis (e.g., JP-2002-121549-A). However, this publication merely discloses examples wherein a derivative of short-chain trialkylene glycol is used as the polyalkylene glycol, and no example with long-chain polyalkylene glycol is disclosed. Such semiconductor nanocrystals having a trialkylene glycol derivative bonded thereto have problems in that, for example, when used as a material for biological diagnosis, the nanocrystals cannot form a stable bond with organic molecules having specific affinity to a particular substance, do not have sufficiently inhibited non-specific adsorption, and cannot be formed into a stable dispersion under physiological conditions.

Further, it is known that, when a low molecular thiol compound, such as a short-chain trialkylene glycol derivative, is used for solubilizing semiconductor nanocrystals in water, fluorescence intensity of the nanocrystals is remarkably lowered compared to the intensity in an organic solvent (e.g., Journal of Colloids and Surfaces, 202, 145 (2002)).

SUMMARY OF THE INVENTION

It is an object of the present invention to provide PEG-modified semiconductor nanoparticles that have a fluorescence intensity effectively inhibited from lowering, that are capable of forming a stable dispersion in water, and that easily form bonds with biomolecules having specific recognition.

It is another object of the present invention to provide PEG-modified semiconductor nanoparticles that have a fluorescence intensity effectively inhibited from lowering, that are capable of forming a stable dispersion in water, and that are suitable for use in biological diagnosis, as well as a material for biological diagnosis containing such nanoparticles.

It is yet another object of the present invention to provide a method for preparing PEG-modified semiconductor nanoparticles, which facilitates preparation of semiconductor nanoparticles that have a fluorescence intensity effectively inhibited from lowering and are capable of forming a stable dispersion in water.

The present inventors have made intensive studies to achieve the above objects. First, studies were made on water-solubilizers for semiconductor nanocrystals that are capable of solubilizing particular II–VI semiconductor nanoparticles in water, and that are also capable of, for example, inhibiting remarkable loss of fluorescence intensity under the physiological conditions, compared to the intensity in an organic solvent. Through the studies, the inventors paid their attention to the utility of PEG of a molecular weight within a particular range having a thiol group at one end. However, such PEG could not sufficiently be bonded to, for example, CdSe semiconductor crystals having a ZnS shell by the method disclosed in JP-2002-121549-A. Further investigations revealed that interposition of cadmium allows easy bonding of the PEG of a molecular weight within a particular range having a thiol group at one end to the CdSe semiconductor crystals having a ZnS shell or the like. The investigations also revealed that introduction of a particular functional group at the other end of the PEG facilitates application of the PEG-modified semiconductor crystals to materials for biological diagnosis. In this way, the present invention has been completed.

According to the present invention, there is provided PEG-modified semiconductor nanoparticles comprising a structure having PEG of a number average molecular weight of 300 to 20000 having a thiol group at one end, bonded via cadmium to II–VI semiconductor nanocrystals of a core-shell structure having a ZnX shell, wherein X stands for O, S, Se, or Te, wherein said PEG-modified semiconductor nanoparticles are water-soluble.

According to the present invention, there is also provided the semiconductor nanoparticles mentioned above, wherein said PEG is a hetero-bifunctional PEG having a thiol group at one end and functional group (A) at the other end, wherein said functional group (A) is selected from the group consisting of aldehyde, hydroxyl, amino, and carboxyl groups.

According to the present invention, there is also provided the semiconductor nanoparticles mentioned above, further comprising a biomolecule having specific recognition bonded to said functional group (A) of the hetero-bifunctional PEG.

According to the present invention there is provided a method for preparing the semiconductor nanoparticles mentioned above, comprising reacting an aqueous solution of PEG of a number average molecular weight of 300 to 20000 having a thiol group at one end, with a cadmium salt and a solution of II–VI semiconductor nanocrystals of a core-shell structure having a ZnX shell, wherein X stands for O, S, Se, or Te.

According to the present invention, there is also provided a method for preparing the semiconductor nanoparticles mentioned above, comprising the steps of:

(A-1) reacting an aqueous solution of polyethylene glycol of a number average molecular weight of 300 to 20000 having a thiol group at one end, with a cadmium salt; and (B-1) reacting a reactant further with II–VI semiconductor nanocrystals of a core-shell structure having a ZnX shell, wherein X stands for O, S, Se, or Te.

According to the present invention, there is further provided a method for preparing the semiconductor nanoparticles mentioned above, comprising the steps of:

(A-2) adding cadmium to a surface of II–VI semiconductor nanocrystals of a core-shell structure having a ZnX shell, wherein X stands for O, S, Se, or Te, to prepare a solution of semiconductor nanocrystals having cadmium on their surface; and (B-2) reacting said solution of semiconductor nanocrystals having cadmium on their surface with an aqueous solution of PEG of a number average molecular weight of 300 to 20000 having a thiol group at one end.

According to the present invention, there is also provided a material for biological diagnosis comprising PEG-modified semiconductor nanoparticles, wherein said PEG-modified semiconductor nanoparticles comprise a hetero-bifunctional PEG of a number average molecular weight of 300 to 20000 having a thiol group at one end and functional group (A) at the other end selected from the group consisting of aldehyde, hydroxyl, amino, and carboxyl groups, and a biomolecule having specific recognition bonded to said functional group (A).

PREFERRED EMBODIMENTS OF THE INVENTION

Figure 1:
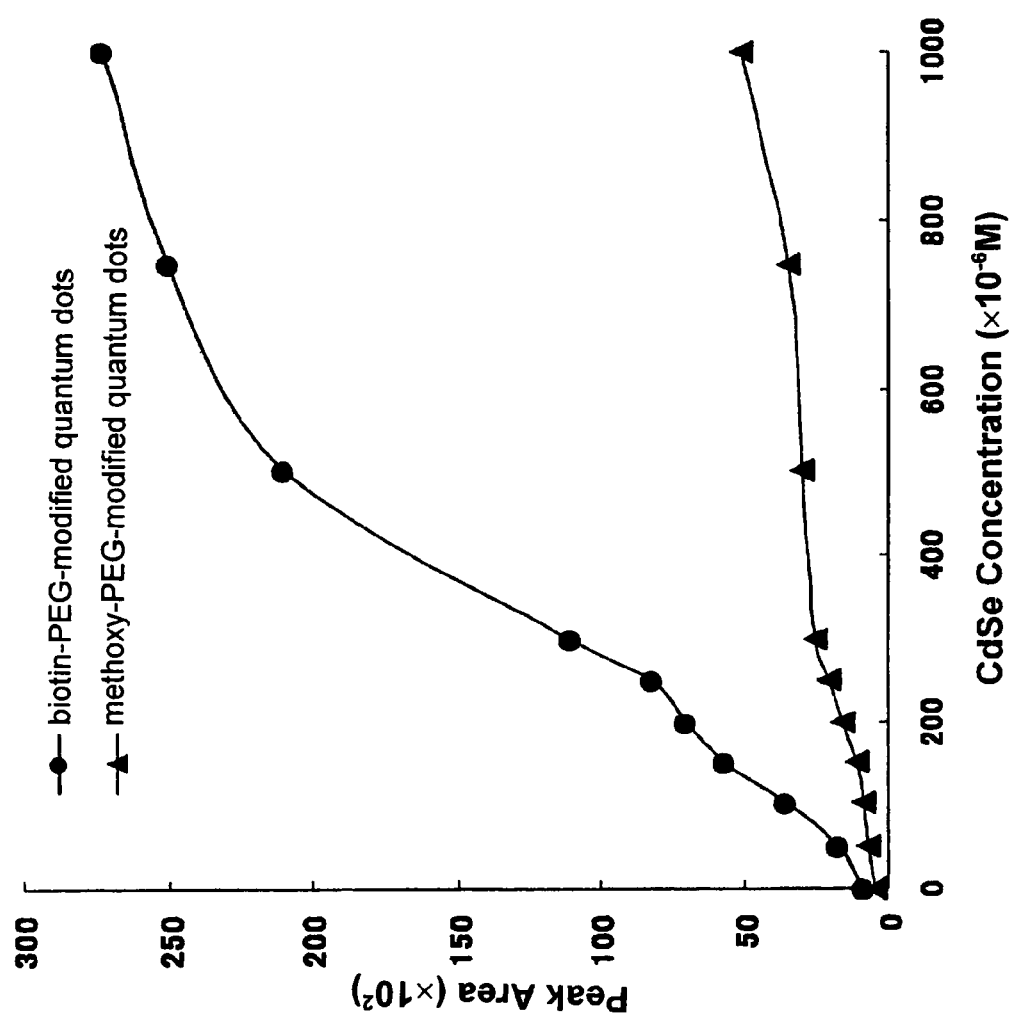
FIG. 1 is a graph showing the results of measurement of energy transfer from the quantum dots to Texas Red, as measured in Example 3.

The present invention will now be explained in detail.

The PEG-modified semiconductor nanoparticles according to the present invention (sometimes referred to as present particles hereinbelow) are water-soluble semiconductor nanoparticles including at least a structure wherein PEG of a particular molecular weight having a thiol group at one end is bonded via cadmium to particular semiconductor nanocrystals, and function as quantum dots and the like.

As used herein, "water-soluble" means that the present particles, when dispersed in water, give a transparent solution without visually observable turbidity.

The particular semiconductor nanocrystals constituting the present particles are II–VI semiconductor nanocrystals of a core-shell structure having a ZnX shell, wherein X stands for O, S, Se, or Te, i.e., a ZnO, ZnS, ZnSe, or ZnTe shell.

The core of the semiconductor crystals may be of any II–VI semiconductor compound, as long as the compound is different from the semiconductor compound of the shell, and the objects of the present invention are achieved. The core may preferably be of CdS, CdSe, CdTe, ZnS, ZnTe, or two or more of these.

When the present particles are to be used as a material for biological diagnosis, particularly preferred core-shell combinations for the semiconductor nanocrystals are those which give a narrow particle size distribution. For example, semiconductor nanocrystals having a CdS and/or CdSe core and a ZnS shell are preferred. The II–VI semiconductor nanocrystals having such a narrow particle size distribution are known to be synthesized in a coordinating solvent, trialkyl phosphine/trialkyl phosphine oxide (U.S. Pat. No. 6,207,229).

The particle size of the semiconductor nanocrystals is usually 1 to 10 nm, preferably 2 to 8 nm for facilitating wavelength control of the light absorbed/emitted due to the quantum effect. The particle size distribution of the semiconductor nanocrystals is not particularly limited. For preparing a material for biological diagnosis, the standard deviation is usually within ±20%, preferably within ±10%.

The PEG of a particular molecular weight that constitutes the present particles is PEG having a thiol group at one end, and having a number average molecular weight of 300 to 20000, preferably 500 to 10000, more preferably 1000 to 7000. With a number average molecular weight of lower than 300, the non-specific adsorption of the resulting quantum dots is not sufficiently inhibited. With a molecular weight of higher than 20000, the PEG may not sufficiently be bonded to the surface of the semiconductor crystals due to the excluded volume of the PEG per se.

The PEG having a particular molecular weight is not necessarily limited to PEG having a single molecular weight, and may be a mixture of two or more preferred PEGs having different number average molecular weights.

Any PEG having a particular molecular weight may be used as long as it has a thiol group at one end. For preparing a material for biological diagnosis, for example, it is preferred that the PEG has a thiol group at one end and functional group (A) at the other end, the functional group (A) being selected from the group consisting of aldehyde, hydroxyl, amino, and carboxyl groups. That is, the PEG is preferably a hetero-bifunctional PEG having different functional groups at the ends.

The hetero-bifunctional PEG maybe represented, for example, by the formula $X^1R^1\text{-}(CH_2CH_2O)\text{n-}R^2SH$, wherein $R^1$ stands for a hydrocarbon group having 0 to 7 carbon atoms, $R^2$ stands for a hydrocarbon group having 1 to 7 carbon atoms, $X^1$ stands for an aldehyde, hydroxyl, amino, or carboxyl group, and n is an integer of 5 to 450.

Use of the hetero-bifunctional PEG represented by the above formula as the PEG constituting the present particles, provides the present particles with inhibitory property on non-specific adsorption of protein and the like. Thus the present particles may find advantageous use in the field of drug delivery systems and physiologically active substances, and achieve effective reduction of background and noise that are problematic in biological diagnosis.

The hetero-bifunctional PEG may be prepared, for example, by polymerizing ethylene oxide using 3,3-diethoxy-1-propanol as an initiator, to obtain α-acetal-ω-hydroxyl PEG, of which hydroxyl group is then converted to a functional group (Bioconjugate Chemistry, 11(6), 947 (2000)).

By this method, hetero-bifunctional PEG of any molecular weight may easily be synthesized by, for example, controlling the quantitative ratio of the initiator and ethylene oxide, as in the synthesis of ordinary PEG. In addition, also as in the synthesis of ordinary PEG, not only monodisperse hetero-bifunctional PEG, but also hetero-bifunctional PEG having the functional groups quantitatively introduced at α- and ω-ends, may be prepared easily.

For preparing, for example, α-aldehyde-ω-thiol PEG as the hetero-bifunctional PEG, the terminal hydroxyl group of α-acetal-ω-hydroxyl PEG is mesylated with methanesulfonyl chloride, converted to dithiocarbonate with potassium O-ethyl dithiocarbonate, and further reduced to thiol with alkylamine, and the resulting product is treated with acid. Further, α-hydroxy-ω-thiol PEG, α-carboxyl-ω-thiol PEG, and α-amino-ω-thiol PEG may be prepared by subjecting α-aldehyde-ω-thiol PEG to reduction, oxidation, or treatment with ammonia followed by aminization by reduction, respectively.

The present particles are semiconductor nanoparticles wherein the semiconductor nanocrystals mentioned above are bonded via cadmium to PEG having a particular molecular weight, such as the hetero-bifunctional PEG and the like. The cadmium bonds to the thiol group of the PEG and to the shell surface of the semiconductor nanocrystals. With such a structure, the present particles may form a stable dispersion or solution in water with the fluorescence intensity being maintained.

The present particles, for example for use as a material for biological diagnosis, may have a biomolecule having specific recognition, bonded to the functional group (A) of the hetero-bifunctional PEG. Such biopolymer may easily be introduced by forming following bonds with the functional group (A). Namely, when the functional group (A) is an aldehyde group, it readily reacts with a primary amino group to form a Schiff base, which is reduced with sodium borohydride or the like under mild conditions, to form an even stabler bond with a ligand. When the functional group (A) is a hydroxyl group, it readily reacts with a carboxyl group in the presence of a dehydration condensing agent to form an ester bond. When the functional group (A) is a carboxyl group, it readily reacts with a hydroxyl or amino group in the presence of a dehydration condensing agent to form an ester or amido bond. When the functional group (A) is an amino group, it readily reacts with a carboxyl group in the presence of a dehydration condensing agent to form an amido bond.

The biomolecule having specific recognition may be any biomolecule as long as it has generally known molecular-biological specific recognition, and has a primary amino, carboxyl, or hydroxyl group. The biomolecule may preferably be, for example, deoxyribonucleic acid, sugars, or proteins such as antibodies.

The present particles having such biomolecules may be prepared into a material for biological diagnosis to be used in gene chips or fluoroimmunoassay, depending on the kind of the biomolecules bonded thereto.

The present particles may be prepared by, for example, reacting an aqueous solution of the PEG of a particular molecular weight mentioned above, with a cadmium salt and the semiconductor nanocrystals mentioned above. More specifically, the present particles may be prepared by a method including the steps of (A-1) reacting an aqueous solution of polyethylene glycol of a number average molecular weight of 300 to 20000 having a thiol group at one end, with a cadmium salt, and (B-1) reacting the reactant with II–VI semiconductor nanocrystals of a core-shell structure having a ZnX shell, wherein X stands for O, S, Se, or Te (referred to as method 1 hereinbelow); or by a method including the steps of (A-2) adding cadmium to a surface of II–VI semiconductor nanocrystals of a core-shell structure having a ZnX shell, wherein X stands for O, S, Se, or Te, to prepare a solution of semiconductor nanocrystals having cadmium on their surface, and (B-2) reacting the solution of semiconductor nanocrystals having cadmium on their surface with an aqueous solution of PEG of a number average molecular weight of 300 to 20000 having a thiol group at one end (referred to as method 2 hereinbelow) or the like method.

The PEG having the particular molecular weight and the semiconductor nanocrystals used in methods 1 and 2 may preferably be those specified above.

The cadmium salt used in methods 1 and 2 may be any salt as long as it contains cadmium and is water-soluble. Examples of the cadmium salt may include cadmium chloride, cadmium acetate, cadmium carbonate, cadmium formate, cadmium nitrate, cadmium sulfate, and cadmium perchlorate. The amount of the cadmium salt may suitably be selected and decided, depending on the material with which it is to be reacted.

In method 1, step (A-1) of reacting the PEG of a particular molecular weight with a cadmium salt is followed by step (B-1) of reacting the reactant with the semiconductor nanocrystals. However, all these materials may simultaneously be introduced into a single reaction system and reacted, resulting in similar reactions.

Method 1 may be performed, for example, by pegylation of the above-mentioned semiconductor nanocrystals modified with alkyl phosphine/alkyl phosphine oxide, which has been synthesized in trialkyl phosphine/trialkyl phosphine oxide, with the PEG having a particular molecular weight in a mixed system of water or a buffer solution and an organic solvent in the presence of a cadmium salt.

The pegylation may usually be carried out in an inert gas atmosphere at 4 to 60° C. for 0.5 to 3 hours.

Method 2 may be performed, for example, by (A-2) adding cadmium to a surface of the above-mentioned semiconductor nanocrystals modified with alkyl phosphine/alkyl phosphine oxide to prepare semiconductor nanocrystals having cadmium on their surface, and then (B-2) pegylating the obtained nanocrystals with the PEG having a particular molecular weight in a mixed system of water or a buffer solution and an organic solvent.

Step (A-2) may be carried out, for example, in an inert gas atmosphere at 60 to 300° C. for 1 minute to 1 hour. In this step, a sulfur-containing solution may be added dropwise to add cadmium to the semiconductor crystal surface in the form of CdS.

Step (B-2) of pegylation may be carried our, for example, in an inert gas atmosphere at 4 to 60° C. for 0.5 to 3 hours.

In methods 1 and 2, the organic solvent used in pegylation may be any solvent as long as it dissolves both the above-mentioned particular PEG and the semiconductor nanocrystals modified with trialkyl phosphine/trialkyl phosphine oxide. Preferred examples of the organic solvent may include chloroform, dichloromethane, benzene, toluene, xylene, ethyl acetate, methyl acetate, diisopropyl acetate, dimethylformamide, dimethylsulfoxide, and dimethylacetamide.

The organic solvent may usually be used in such an amount that the concentration of the semiconductor nanocrystals therein is about 2 µg/ml to 20 mg/ml.

In methods 1 and 2, the PEG having a particular molecular weight is usually used in an excess amount, i.e. not less than 0.1 mole equivalent with respect to the constitutional elements of the semiconductor nanocrystals. Thus, after the reaction, the PEG of a particular molecular weight that is left unreacted, must be removed. Such unreacted PEG may be removed by precipitating the present particles by means of centrifugation to separate from the PEG, or by dialysis or using a column.

After the pegylation in methods 1 and 2, for example, a nonpolar organic solvent may be added to the pegylated reaction liquid to separate an organic phase from an aqueous phase, in the latter of which the particles of the present invention are obtained in a dissolved state. The present particles thus obtained may be used as they are, depending on their application, or may be subjected to extraction purification, drying, and the like process to be formed into powders.

The nonpolar organic solvent is in general a hydrocarbon organic solvent, and may be pentane, hexane, heptane, octane, or the like.

Since the PEG-modified semiconductor nanoparticles of the present invention have the PEG of a particular molecular weight bonded to the surface of the semiconductor nanocrystals, lowering of the fluorescence intensity is effectively inhibited, and a stable dispersion may be formed in water. Further, when the PEG of a particular molecular weight has biomolecules with specific recognition, the present particles are particularly useful as a material for biological diagnosis.

Since, in the methods of the present invention, the PEG of a particular molecular weight is reacted with particular semiconductor nanocrystals via cadmium, semiconductor nanoparticles may be prepared easily and conveniently, of which fluorescence intensity is effectively inhibited from lowering, and which are capable of forming a stable dispersion in water.

EXAMPLES

The present invention will now be explained in more detail with reference to Examples, but the present invention is not limited to these.

Preparation Example 1

Preparing Solution of CdSe Semiconductor Nanocrystals Having ZnS Shell (CdSe—ZnS Semiconductor Nanocrystals)

Semiconductor nanocrystals were synthesized in the following process in accordance with the method described in Qu et al., J.Amer.Chem.Soc., 129 (4), 2049 (2002).

(Preparation of Selenium Solution)

319.6 mg of selenium was measured out in a pear-shaped flask, and 1.186 ml of tributyl phosphine (abbreviated as TBP hereinbelow) and 8.51 ml of dioctylamine (abbreviated as DOA hereinbelow) were added using syringes in an argon atmosphere. The mixture was stirred at a room temperature until selenium was totally dissolved to give a colorless, transparent solution. The obtained selenium solution was refrigerated until immediately before use.

(Preparation of Solution of CdSe Nanocrystals)

A three-necked flask equipped with a cooling tube, a thermometer, and a three-way cock was flushed with argon gas. 50.8 mg of cadmium oxide (CdO) and 456 mg of stearic acid were placed in the flask, and heated to 150° C. to totally dissolve CdO. After the reaction vessel was cooled down near the room temperature, 7.76 g of trioctyl phosphine oxide (abbreviated as TOPO hereinbelow) and 7.76 g of hexadecylamine (abbreviated as HDA hereinbelow) were added, and heated to 300° C. to give a colorless, transparent solution. Next, 1 ml of the selenium solution prepared above (Cd/Se=1/1) was added at a time using a syringe to start the reaction. After the reaction was terminated in 7 minutes, a small amount of the reaction liquid was taken out and irradiated with UV to confirm, by the presence of fluorescence, that CdSe nanocrystals were obtained. Thus it was determined that the resulting reaction liquid was a solution of CdSe nanocrystals.

(Preparation of Zn/S-containing Solution)

In a pear-shaped flask flushed with argon gas, 1 ml of a 1M heptane solution of diethyl zinc (1 mmol), 267 µl of bis(trimethylsilyl)sulfide (1.257 mmol), and 7.5 ml of TBP were placed using syringes, and reacted to give a Zn/S-containing solution. This solution was refrigerated until immediately before use.

(Preparing Solution of CdSe—ZnS Semiconductor Nanocrystals)

A three-necked flask equipped with a cooling tube, a thermometer, and a three-way cock was flushed with argon. 2.5 ml of the solution of CdSe nanocrystals prepared above was placed in the flask, and heated to 220° C. Then 1.4 ml of the Zn/S-containing solution (Cd/Zn=1/4) prepared above was slowly added dropwise at a rate of 1 drop per 5 seconds. After the dropwise addition was finished, the bath was cooled to 100° C., and stirred for 1 hour. After the reaction was completed, the reaction mixture was dissolved in an appropriate amount (2 to 10 volumes) of chloroform, and methanol was added until a trace amount of insolubles were formed. The mixture was centrifuged to precipitate the insoluble, and the supernatant was removed by decantation, to obtain a deposit of CdSe—ZnS nanocrystals. The obtained deposit was mixed with chloroform to dissolve so that the content of CdSe in the deposit was 10 µmol/ml, and a solution of CdSe—Zn nanocrystals was obtained.

Preparation Example 2

Preparing Solution of CdSe Semiconductor Nanocrystals Having CdS Added to ZnS Shell Surface (CdSe—ZnS—CdS Semiconductor Nanocrystals)

(Preparation of S-containing Solution)

In a pear-shaped flask flushed with argon gas, 267 µl (1.257 mmol) of bis(trimethylsilyl)sulfide and 8.5 ml of TBP were placed using syringes to obtain a S-containing solution. This solution was refrigerated until immediately before use.

(Synthesis of CdSe—ZnS—CdS Semiconductor Nanocrystals)

A three-necked flask equipped with a cooling tube, a thermometer, and a three-way cock was flushed with argon gas. 2.5 ml of the solution of CdSe—ZnS semiconductor nanocrystals prepared in Preparation Example 1 was placed in the flask, and chloroform was distilled off. 0.1 g of TOP and 7.8 mg of cadmium stearate were introduced, and heated to 220° C. Then 175 µl of the S-containing solution prepared above (in an amount to achieve CdSe/CdS=1/0.5) was slowly added dropwise at a rate of 1 drop per 5 seconds. After the dropwise addition was finished, the bath was cooled to 100° C., and stirred for 1 hour. After the reaction was completed, the reaction mixture was dissolved in an appropriate amount (2 to 10 volumes) of chloroform, and methanol was added until a trace amount of insolubles were formed. The mixture was centrifuged to precipitate the insoluble, and the supernatant was removed by decantation, to obtain a deposit of CdSe—ZnS—CdS semiconductor nanocrystals. The obtained deposit was mixed with chloroform so that the content of CdSe in the deposit was 10 µmol/ml, and a solution of CdSe—ZnS—CdS semiconductor nanocrystals was obtained.

Preparation Example 3

Synthesis of α-Acetal-ω-thiol-PEG (Hetero-Bifunctional PEG)

α-Acetal-ω-thiol-PEG was synthesized in the following process in accordance with the method described in Akiyama et al., Bioconj Chem, 11(6), 947, 2000.

Using 3,3-diethoxy-1-propanol treated with potassium naphthalene, ethylene oxide was polymerized. The terminal hydroxyl group of the resulting α-acetal-ω-OH-PEG was methanesulfonylated, O-ethyl dithiocarbonated, and reduced to synthesize α-acetal-ω-thiol-PEG. The molecular weight of the α-acetal-ω-thiol-PEG had been adjusted by controlling the quantitative ratio of the initiator and ethylene oxide, and two kinds of hetero-bifunctional PEGs were obtained having a number average molecular weight of 5000 and 2000, respectively. The hetero-bifunctional PEGs thus obtained were analyzed by $^1$H-NMR and GPC, and determined to be α-acetal-ω-thiol-PEGs of the particular molecular weight having fixed amounts of terminal functional groups introduced therein.

Example 1

Preparation of PEG-modified CdSe—ZnS Semiconductor Particles

To 100 µl of the solution of CdSe—ZnS semiconductor nanocrystals prepared in Preparation Example 1, 50 mg of the hetero-bifunctional PEG of a number average molecular weight of 5000 prepared in Preparation Example 3 and 1.65 mg of $CdCl_2$ dissolved in 1 ml of phosphate buffer were added, and vigorously stirred in oblique rays at a room temperature. After 30 minutes, 10 ml of n-hexane and 9 ml of phosphate buffer were added, and vigorously stirred for additional 5 minutes. The mixture was then left still to phase-separate. Upon irradiation with UV (254 nm), fluorescence was observed only in the lower phase (aqueous phase).

On the other hand, when $CdCl_2$ was not added, fluorescence was observed only in the upper phase (organic phase). It was thus demonstrated that, due to the reaction of the cadmium salt, the hetero-bifunctional PEG was bonded to the surface of the CdSe—ZnS semiconductor crystals to solubilize the semiconductor crystals in water.

Further, as a result of fluorescence spectrum analysis after the phase separation, it was confirmed that the peak positions, half-width, and fluorescence intensity of the semiconductor nanoparticles before the water-solubilization were maintained in the fluorescence spectrum of the aqueous phase.

Example 2

Preparation of PEG-modified CdSe—ZnS—CdS Semiconductor Particles

To 100 µl of the solution of CdSe—ZnS—CdS semiconductor nanocrystals prepared in Preparation Example 2, 1 ml of phosphate buffer and 20 mg of the hetero-bifunctional PEG of a number average molecular weight of 2000 prepared in Preparation Example 3 were added, and vigorously stirred in oblique rays at a room temperature. After 30 minutes, 10 ml of n-hexane and 9 ml of phosphate buffer were added, and vigorously stirred for additional 5 minutes. The mixture was then left still to phase-separate. Upon irradiation with UV (254 nm), fluorescence was observed only in the lower phase (aqueous phase).

Next, the obtained solution was ultracentrifuged (230000 g×20 minutes) to precipitate, the supernatant was removed, and phosphate buffer was added. Similar operation was repeated two additional times. The thus obtained PEG-modified CdSe—ZnS—CdS semiconductor particles were lyophilized, and $^1$H-NMR ($D_2O$, 64 times accumulation) was measured to confirm the pegylation. In the results, only the protons derived from the PEG were observed, and no methyl protons derived from alkyl phosphine/alkyl phosphine oxide were observed at all.

The solution of PEG-modified CdSe—ZnS—CdS semiconductor particles prepared above was placed in a quartz cell, and the change in the transmitted light was measured over time at 37° C. for 180 hours using a spectrophotometer (at the transmitted light wavelength of 700 nm). As a result, no change was observed in the light transmittance, and the PEG-modified CdSe—ZnS—CdS semiconductor particles were maintained in a stable dispersion under the physiological conditions without coagulation or precipitation. Further, upon irradiation with UV (254 nm) of the sample after the measurement of the time-related change, the sample was confirmed to exhibit uniform coloring.

Example 3

Preparation of Biotin-PEG-Modified Quantum Dots

An aqueous solution of the hetero-bifunctional PEG having a number average molecular weight of 5000 prepared in Preparation Example 3 was prepared, and the pH of the solution was adjusted to 2.1 by adding 1N and 0.1 N hydrochloric acid dropwise. After stirring at a room temperature for 2 hours, the pH was adjusted to 8 by adding 1N and 0.1 N sodium hydroxide. The resulting solution was desalted by dialysis, and lyophilized, to obtain α-aldehyde-ω-thiol-PEG. An aqueous solution of the α-aldehyde-ω-thiol-PEG was prepared, an equivalent mole of biocytin hydrazide was added, and the resulting mixture was stirred at a room temperature. After 2 hours, $NaBH_4$ was added, and the mixture was further stirred for 1 hour. The obtained solution was dialyzed/lyophilized in the same way as above. The thus obtained compound was confirmed by $^1$H-NMR and GPC to be α-biotin-ω-thiol-PEG.

Next, biotin-PEG-modified quantum dots (material for biological diagnosis) were prepared as CdSe—ZnS—CdS semiconductor particles modified with α-biotin-ω-thiol-PEG, in the same way as in Example 2, except that the hetero-bifunctional PEG of a number average molecular weight of 2000 prepared in Preparation Example 3 was replaced with the α-biotin-ω-thiol-PEG prepared above.

On the other hand, as a reference for a material for biological diagnosis, quantum dots modified with α-methoxy-ω-thiol-PEG were prepared in the same way as above using α-methoxy-ω-thiol-PEG.

The biotin-PEG-modified quantum dots and α-methoxy-ω-thiol-PEG-modified quantum dots were respectively dissolved in a PBS solution, avidin labeled with commercially available Texas Red was added, and the mixtures were respectively stirred at a room temperature. After 1 hour, the fluorescence spectrum was measured (at an excitation wavelength of 400 nm), and the area of the fluorescence spectrum derived from Texas Red was integrated (peak area). At different quantitative ratios of the α-biotin-ω-thiol-PEG-modified quantum dots or α-methoxy-ω-thiol-PEG-modified quantum dots to the Texas Red-labeled avidin, the energy transfer from the quantum dots to Texas Red was measured in this way. The results are shown in FIG. 1.

It is seen from FIG. 1 that the specific interaction between biotin and avidin shortened the distance between the quantum dots and Texas Red, which resulted in effective energy transfer.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. Polyethylene glycol-modified semiconductor nanoparticles comprising a structure having polyethylene glycol of a number average molecular weight of 1000 to 7000 having a thiol group at one end, bonded directly via cadmium to II–VI semiconductor nanocrystals of a core-shell structure having a ZnX shell, wherein X stands for O, S, Se, or Te, wherein said semiconductor nanoparticles are water-soluble.

2. The semiconductor nanoparticles of claim 1, wherein a core of said II–VI semiconductor nanocrystals is selected from the group consisting of CdS, CdSe, CdTe, ZnSe, and ZnTe.

3. The semiconductor nanoparticles of claim 1, wherein said polyethylene glycol is hetero-bifunctional polyethylene glycol having a thiol group at one end and functional group (A) at the other end, wherein said functional group (A) is selected from the group consisting of aldehyde, hydroxyl, amino, and carboxyl groups.

4. The semiconductor nanoparticles of claim 3 further comprising a biomolecule having specific recognition bonded to said functional group (A) of the hetero-bifunctional polyethylene glycol.

5. A method for preparing semiconductor nanoparticles of claim 1, comprising reacting an aqueous solution of polyethylene glycol of a number average molecular weight of 1000 to 7000 having a thiol group at one end, with a cadmium salt and II–VI semiconductor nanocrystals of a core-shell structure having a ZnX shell, wherein X stands for O, S, Se, or Te.

6. A method for preparing semiconductor nanoparticles of claim 1, comprising the steps of: (A-1) reacting an aqueous solution of polyethylene glycol of a number average molecular weight of 1000 to 7000 having a thiol group at one end, with a cadmium salt; and (B-1) reacting a reactant further with II–VI semiconductor nanocrystals of a core-shell structure having a ZnX shell, wherein X stands for O, S, Se, or Te.

7. A method for preparing semiconductor nanoparticles of claim 1, comprising the steps of: (A-2) adding cadmium to a surface of II–VI semiconductor nanocrystals of a core-shell structure having a ZnX shell, wherein X stands for O, S, Se, or Te, to obtain a solution of semiconductor nanocrystals having cadmium on their surface; and (B-2) reacting said solution of semiconductor nanocrystals having cadmium on their surface with an aqueous solution of polyethylene glycol of a number average molecular weight of 1000 to 7000 having a thiol group at one end.

8. A material for biological diagnosis comprising semiconductor nanoparticles of claim 4.

* * * * *